United States Patent [19]

Arcidiacono et al.

[11] 4,410,867
[45] Oct. 18, 1983

[54] ALPHA TANTALUM THIN FILM CIRCUIT DEVICE

[75] Inventors: Frank R. Arcidiacono, North Andover; Gerard J. Koerckel, Andover, both of Mass.

[73] Assignee: Western Electric Company, Inc., New York, N.Y.

[21] Appl. No.: 197,878

[22] Filed: Oct. 17, 1980

Related U.S. Application Data

[62] Division of Ser. No. 974,162, Dec. 28, 1978, Pat. No. 4,251,326.

[51] Int. Cl.³ .................. H03H 1/02; H03H 7/06
[52] U.S. Cl. .................. 333/172; 361/306; 361/311
[58] Field of Search ......... 333/172; 361/303–311, 361/321–322; 29/620

[56] References Cited

U.S. PATENT DOCUMENTS

| | | | |
|---|---|---|---|
| 3,607,679 | 9/1971 | Melroy et al. | 204/15 |
| 3,616,282 | 10/1971 | Bodway | 204/15 |
| 3,718,565 | 11/1973 | Pelletier | 204/192 |
| 3,988,824 | 11/1976 | Bodway | 29/577 |
| 4,058,445 | 11/1977 | Anders | 204/192 |

OTHER PUBLICATIONS

Anders—"Nitrogen-Doped Tantalum Thin Film Capacitors with Improved Temperature Stability", Thin Solid Films, vol. 27, 1975; pp. 135–140.
Anders—Properties of Tantalum Thin-Film Capacitors Variously Doped with Nitrogen as a Function of Frequency and Bias Voltage", Frequency, vol. 29, No. 5, 1975; pp. 133–136.
Duft et al.—"A High Stability RC Circuit Using High Nitrogen Doped Tantalum", Proceedings of the 28th Electronic Components Conference, Apr. 1978; pp. 229–233.

*Primary Examiner*—Marvin L. Nussbaum
*Attorney, Agent, or Firm*—D. D. Bosben

[57] ABSTRACT

Fabricating thin film RC networks (10) includes forming alpha tantalum capacitor base electrodes (14be) on a substrate (12), while simultaneously forming alpha tantalum anodization bus bars (14p and 14s) on the substrate. A portion of each base electrode (14be) then is anodized to form a capacitor dielectric (20) in a single anodizing step. A tantalum nitride resistor film (24) and electrically conductive films (26 and 28) then are deposited on the resultant assembly. Next, portions of the electrically conductive films are removed to define portions of capacitor counterelectrodes (22), to expose sections of the tantalum nitride resistor film (24) destined for use as resistors (24r), and to define conductor networks (30). Portions of the tantalum nitride resistor film (24) then are removed to define capacitor counterelectrode portions (24ce) and the resistors (24r), while simultaneously removing the anodization bus bars (14p and 14s). The resultant networks (10) then are thermally stabilized.

7 Claims, 12 Drawing Figures

ALPHA TANTALUM THIN FILM CIRCUIT DEVICE

This is a division, of application Ser. No. 974,162 filed Dec. 28, 1978.

TECHNICAL FIELD

This invention relates to an alpha tantalum thin film circuit device and more specifically to the fabricating of a precise and reliable RC network utilizing alpha tantalum wherein a method of fabricating the RC network is less complex and more economical than prior known methods.

BACKGROUND OF THE INVENTION

The D. O. Melroy et al. Pat. No. 3,607,679 discloses a relatively complex method of fabricating an RC network in which a layer of beta tantalum is deposited on a substrate and then selectively etched in a masking process to define a resistor window and a capacitor slit. An initial layer of a tantalum pentoxide capacitor dielectric next is formed on a beta tantalum capacitor electrode by masking and anodization to provide an etch stop for the electrode during subsequent processing. Layers of tantalum nitride and a contact film base conductor (e.g., tantalum-gold or nickel-chromium-gold) then are sequentially sputtered on the resultant assembly. The contact film base conductor then is masked and selectively etched to define resistor and capacitor areas. Next, the assembly is masked and tantalum nitride is etched from the resistor area to form a resistor pattern, and from the capacitor dielectric area to permit final forming of the capacitor dielectric in a subsequent anodization process. During the etching of the tantalum nitride, the initial capacitor dielectric functions as an etch stop to protect the beta tantalum capacitor electrode as noted previously.

The assembly next is masked and a portion of the tantalum nitride film is anodized to form a resistor, after which the assembly is heat treated to thermally stabilize the resistor. Following the heat treatment, the assembly is again masked and the capacitor dielectric area of the circuit is reanodized to complete formation of the capacitor dielectric. An electrically conductive film (e.g., nickel-chromium-gold) then is deposited on the resultant assembly. Finally, the electrically conductive film is selectively etched in a masking process to define a conductor network and a capacitor counterelectrode.

In another embodiment in the Melroy et al. patent, the capacitor and the resistor are formed in a reverse order from the embodiment described hereinabove. Initially, a resistor is formed by anodizing a portion of a tantalum nitride film which has been deposited on a substrate, after which the resultant assembly is heat treated to thermally stabilize the resistor. A beta tantalum film then is deposited on the assembly, and the beta tantalum film and the tantalum nitride film are selectively etched to define a capacitor slit in the films. A portion of the beta tantalum film then is anodized to produce a tantalum pentoxide capacitor dielectric. Next, an electrically conductive film (e.g., nickel-chromium-gold) is plated on the assembly and then selectively etched to define a capacitor counterelectrode and a conductor pattern.

The Anders U.S. Pat. No. 4,058,445 discloses a method of producing a thin film tantalum capacitor utilizing an alpha tantalum base electrode. A tantalum pentoxide capacitor dielectric then is grown on the base electrode by oxidation. The dielectric then is covered with another electrode, whereupon the completed capacitor is heat treated. The Anders patent also suggests that with the method disclosed therein it is possible to fabricate RC networks, with the resistor and capacitor films being deposited directly one after another.

A known process for fabricating a thin film RC network utilizing alpha tantalum is patterned after the above-described first embodiment of the Melroy et al. patent. For example, in the fabricating of a plurality of RC networks on a ceramic substrate, this process involves the initial steps of selectively glazing the substrate in proposed capacitor areas, sputtering a tantalum film on the substrate, thermally oxidizing the tantalum film to form a deposit underlay, and then sputtering an alpha tantalum film over the deposit underlay. The alpha tantalum film next is masked and selectively etched to define a capacitor base electrode for each of the networks and to define anodization bus bars which are connected to the capacitor base electrodes. A tantalum pentoxide capacitor dielectric then is grown on the capacitor base electrode by masking and anodizing to form an etch stop during subsequent processing.

A tantalum nitride resistor film next is sputtered on the resultant assembly, and films of titanium and palladium are sequentially sputtered over the resistor film to insure good ohmic contact during subsequent processing. The titanium and palladium films then are selectively etched in a masking process to define contact spots for the resistors and capacitors subsequently to be formed. The tantalum nitride film next is selectively etched in a masking process to define the resistors, and to expose the initially formed capacitor dielectric etch stop layer, after which the formation of the capacitor dielectric is completed in a second masking and anodizing step.

After heat treatment to thermally stabilize the resistance and capacitance properties of the RC networks, any palladium oxide which has formed on the contact spots for the resistors and capacitors is reduced to restore good ohmic contact for the resistors and capacitors. Nickel-chromium and palladium films then are sequentially sputtered on the assembly to produce a dual adhesive "glue" layer which facilitates adhesion of gold to the assembly, after which a gold film is plated on the adhesive layer. Next, the electrically conductive films are masked and selectively etched to define conductor networks and capacitor counterelectrodes. The alpha tantalum anodization bus bars then are removed by masking and etching in a separate etching operation. Subsequently, the substrate is scribed to separate the completed RC networks into discrete independent units.

The above-described method of forming thin film RC networks utilizing alpha tantalum has a number of disadvantages. For example, the method involves a large number of processing steps, including a large number of mask levels, resulting in a relatively complex process. For example, the formation of the capacitance dielectrics is accomplished in two separate masking and anodization steps, the first to provide an etch stop for the capacitor base electrodes and the second to complete the formation of the dielectrics. Further, since the formation of the tantalum nitride film and the electrically conductive film are separated by intervening steps, the formation of titanium-palladium contact spots, which involves sputtering, masking and etching steps, and the reduction of palladium oxide on the contact spots after heat treatment of the networks, is required to insure good ohmic contact between the tantalum nitride film and the subsequently formed resistors and capacitors. In addition, removal of the alpha tantalum anodization bus bars must be accomplished in a separate masking and etching operation. As a net result, the described method involves a significant amount of labor and material expense, with a long manufacturing interval.

Accordingly, a purpose of this invention is to provide economical method of fabricating and economical method of fabricating a thin film RC network of high precision and reliability which can be fabricated with a reduction in the number of processing steps and mask levels involved.

SUMMARY OF THE INVENTION

A thin film capacitor comprises an alpha tantalum base electrode having first and second adjacent portions. A capacitor dielectric is formed on only the first portion of the base electrode such that the second portion of the base electrode can be direct-connected to an electrical conductor. A capacitor counterelectrode is formed on the capacitor dielectric and includes a layer of tantalum nitride in direct contact with a first portion of the capacitor dielectric. The layer of tantalum nitride extends over the first portion of the capacitor dielectric from adjacent one end of the dielectric toward the second portion of the base electrode in essentially parallel relationship to the first portion of the base electrode and terminates in spaced relationship to the second portion of the base electrode such that the tantalum nitride layer and the second portion of the base electrode are separated by a second portion of the capacitor dielectric.

More specifically, the capacitor counterelectrode further includes an electrically conductive layer which overlies an electrically conductive adhesive layer overlying the tantalum nitride layer. The electrically conductive adhesive layer includes a titanium film formed in direct contact with the capacitor dielectric and a palladium film between the titanium film and the electrically conductive layer. The thin film capacitor also forms part of a thin film RC network in which a tantalum nitride resistor is electrically connected to one of the capacitor electrodes. Further, a conductor network is direct-connected by associated circuit paths, including the tantalum nitride resistor, to the capacitor counterelectrode and the second portion of the base electrode.

DETAILED DESCRIPTION

Figure 1:
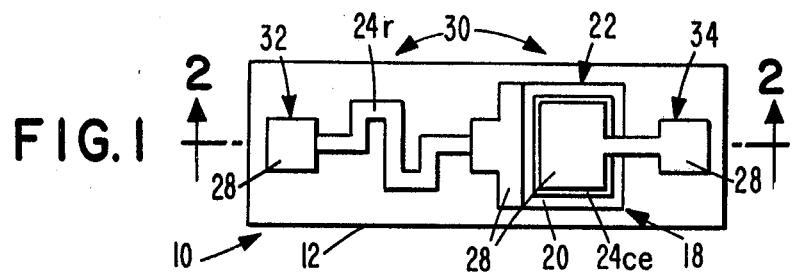
FIG. 1 is a plan view of a completed discrete tantalum thin film RC network fabricated on a substrate in accordance with the invention.

The disclosed embodiment of the invention is directed to the fabricating of tantalum thin film RC networks 10 (FIGS. 1, 2H and 5) on a substrate 12 utilizing an alpha tantalum film 14 (FIG. 2A) which has been deposited on a protective tantalum pentoxide underlayer 16. Each of the RC networks 10 comprises a capacitor 18 which includes a capacitor base electrode 14be (FIG. 2H) formed from the alpha tantalum film 14, an anodized tantalum pentoxide capacitor dielectric 20 formed on a first portion of the base electrode, and a capacitor counterelectrode 22. Each RC network 10 also includes a tantalum nitride resistor 24r formed from a tantalum nitride resistor layer or film 24 (FIG. 2D) and connected to an unanodized second portion of the capacitor base electrode 14be adjacent the first portion thereof.

Figure 2A:
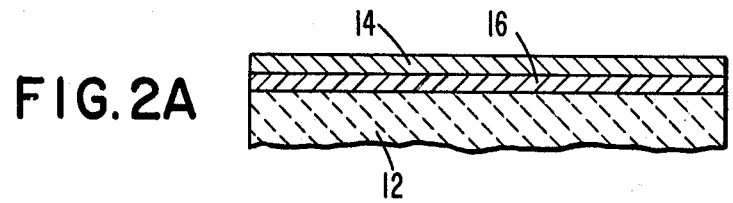
FIGS. 2A through 2H are cross-sectional views, taken along the line 2—2 in FIG. 1, illustrating successive stages of manufacture of the RC network in FIG. 1.
Figure 2B:
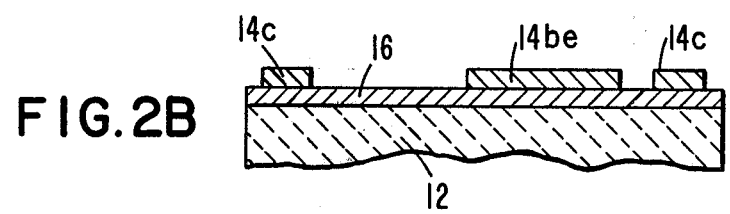
Figure 2C:
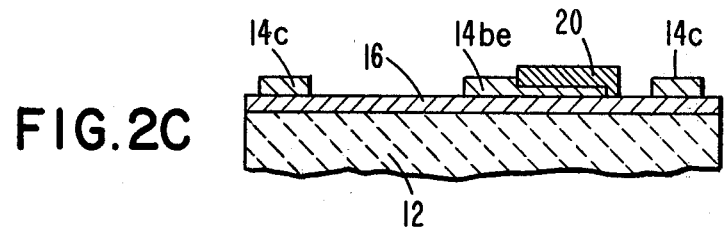
Figure 2D:
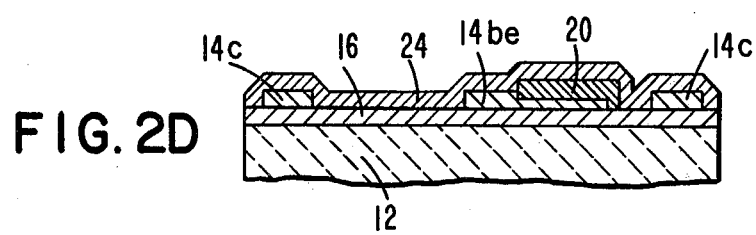
Figure 2E:
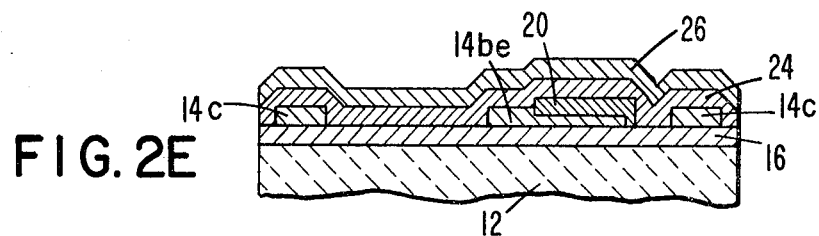
Figure 2F:
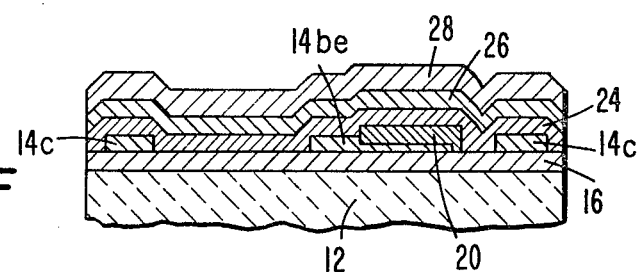
Figure 2G:
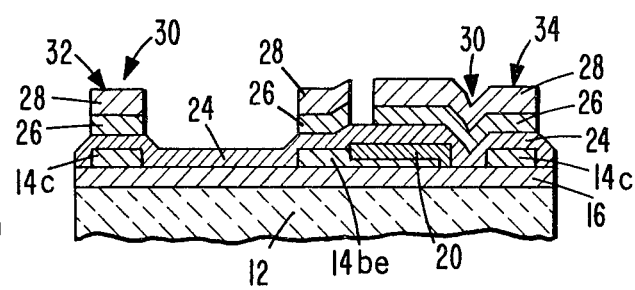
Figure 2H:
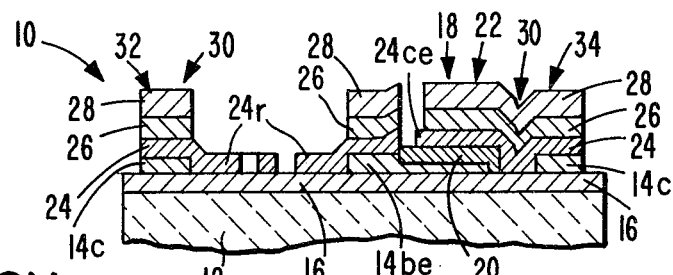

As is clearly shown in FIG. 2H, the capacitor counterelectrode 22 includes a portion 24ce formed from the tantalum nitride resistor layer or film 24, a portion formed from an inner electrically conductive dual adhesive "glue" layer or film 26 (FIG. 2E) composed of two sequentially deposited metals, such as titanium and palladium, and a portion formed from an outer electrically conductive film 28 (FIG. 2F) of a metal such as gold. The tantalum nitride layer portion 24ce is formed directly in contact with a first portion of the capacitor dielectric 20 and extends over the first portion of the capacitor dielectric from adjacent one end of the dielectric toward the above-mentioned unanodized second portion of the base electrode 14be in parallel relationship to the above-mentioned first portion of the base electrode. A left-hand end of the tantalum nitride layer portion 24ce, as viewed in FIG. 2H, terminates in spaced relationship to the unanodized second portion of the base electrode 14be such that the tantalum nitride layer portion and the unanodized second portion of the base electrode are separated by a second portion of the capacitor dielectric 20. After the RC networks 10, as shown in FIG. 5, are separated into discrete independent units as shown in FIGS. 1 and 2H, each RC network is connectable to associated external circuits (not shown) by a conductor pattern or network 30, including contact pads 22 and 34 direct-connected to the capacitor base electrode 14be and to the capacitor counterelectrode 22, respectively, through associated circuit paths, including the resistor 24r.

The substrate 12 may be of any suitable material, such as ceramic, which is provided with glazed sections (not shown) in those areas in which the capacitors 18 are to be formed on the substrate. After cleaning of the substrate 12 in a known manner, a thin protective layer of a film-forming metal, such as tantalum, may be deposited on the substrate by conventional sputtering techniques and then thermally oxidized to produce the tantalum pentoxide underlayer 16, which protects the substrate from attack by corrosive etchants during the course of subsequent processing.

Figure 5:
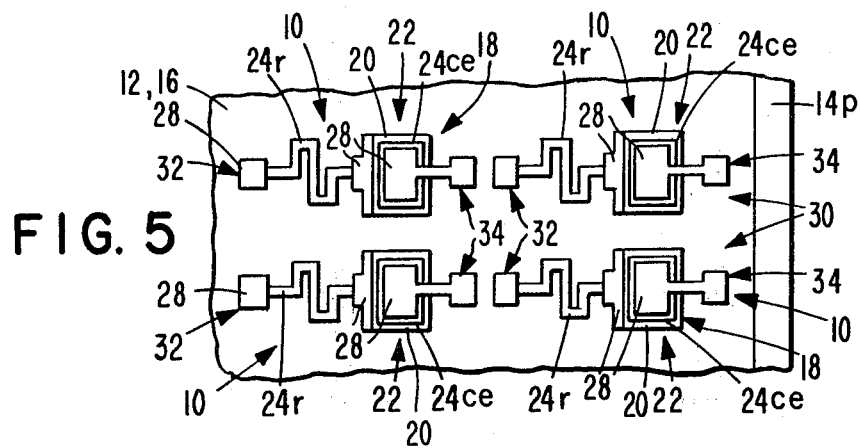
FIG. 5 is a plan view similar to FIG. 3, showing completed RC networks as shown in FIGS. 1 and 2H, prior to separation into discrete independent units as shown in FIGS. 1 and 2H.

Referring to FIGS. 2A and 2B, initially the film of alpha tantalum 14 is formed on the protective underlayer 16 on the substrate 12 so as to define the capacitor base electrode 14be (FIG. 2B) and initial layers 14c of the contact pads 32 and 34 of each of the RC networks 10 as shown in FIGS. 1, 2H and 5. With reference to FIG. 2A, this is accomplished by first depositing the alpha tantalum film 14 over the entire surface of the protective underlayer 16 in a suitable manner, such as by cathodic sputtering techniques. By way of illustration, the sputtering may be of the magnetically enhanced type carried out in an argon-nitrogen atmosphere at a sputtering pressure of 3–6 microns.

For the purpose of this invention, the sputtered alpha tantalum film 14 has a body-centered cubic structure with an atom nitrogen content which may vary within a range of 10–20%. The thickness of the deposited alpha tantalum film 14 also may vary, depending on the anodizing voltage to be used in forming the capacitor dielectrics 20. For example, for a 210 volt capacitor dielectric forming voltage, favorable results have been achieved with a film nitrogen content of 16% and a film thickness of 3,000–4,000 angstroms. For other capacitor dielectric forming voltages the thickness of the alpha tantalum film may be increased or decreased, accordingly.

After the alpha tantalum film 14 has been deposited on the protective underlayer 16 as shown in FIG. 2A, the alpha tantalum film is selectively etched using a photolithographic masking process so as to completely remove certain portions of the film as illustrated in FIG. 2B, to form the capacitor base electrode 14be and the initial layers 14c of the contact pads 32 and 34 of each of the RC networks 10 as noted hereinabove. At the same time, referring to FIG. 3, portions of the alpha tantalum film 14 are removed to define a system of anodization bus bars, which includes a primary bus bar 14p located along one edge of the substrate 12 and secondary bus bars 14s which electrically connect the primary bus bar to the capacitor base electrodes 14be. Any one of a number of well known conventional etchants may be used for the etching of the alpha tantalum layer 14, as for example a 5:1:1 solution of hydrofluoric acid, nitric acid and water.

Referring to FIG. 2C, the substrate assembly as illustrated by FIG. 2B then is suitably masked and the above-mentioned first portion of each capacitor base electrode 14be is electrolytically anodized to form or grow the capacitor dielectric 20 on the base electrode to a desired final configuration and thickness in a single anodizing step such that the above-mentioned second portion of the dielectric remains unanodized. By way of illustration, to achieve the 210 volt capacitor dielectric forming voltage noted hereinabove, the anodization may be carried out at a current level so as to cause growth of the capacitor dielectric 20 at a rate of 4 volts per minute. Subsequently, when the nominal capacitor dielectric forming voltage of 210 volts is reached, the substrate assembly as illustrated in FIG. 2C is subjected to a one hour soak period.

With reference to FIG. 2D, the tantalum nitride resistor film layer 24, which preferably has an atom nitrogen content of 28–33%, next is deposited over the entirety of the substrate assembly as illustrated by FIG. 2C, including each capacitor base electrode 14be, the initial layers 14c of the associated contact pads 32 and 34, and the capacitor dielectric 20 on the base electrode. As in the sputtering of the alpha tantalum film 14 (FIG. 2A), the sputtering of the tantalum nitride resistor film 24 may be accomplished in an argon-nitrogen atmosphere at a sputtering pressure of 3–6 microns. During the sputtering operation, to achieve proper sputtering without causing thermal damage to the capacitor dielectrics 20, the substrate assembly temperature preferably is maintained below 300° C. The thickness of the tantalum nitride resistor film 24 so deposited preferably is on the order of 300–400 angstroms. In this regard, an attempt to produce a thicker layer of the tantalum nitride resistor film 24 increases the time of exposure of the capacitor dielectrics 20 to thermal energy during the sputtering process, thus increasing the possibility of damage to the dielectrics.

As is shown in FIG. 2E, the inner electrically conductive, dual adhesive "glue" layer 26 is next deposited over the entirety of the tantalum nitride resistor film 24 to facilitate subsequent adhesion of the outer electrically conductive gold film 28 (FIG. 2F) to the tantalum nitride resistor film. Referring to FIG. 2F, the outer electrically conductive gold film 28 then is plated over the dual adhesive "glue" layer 26 in any suitable manner.

The dual adhesive "glue" layer 26 may be formed by sequentially sputtering suitable electrically conductive metals, such as titanium and palladium as noted hereinabove, in an argon atmosphere at a sputtering pressure of 3–6 microns. As in the sputtering of the tantalum nitride resistor film 24, to achieve proper sputtering of the dual adhesive "glue" layer 26 without causing damage to the capacitor dielectrics 20, the substrate assembly temperature is maintained below 300° C.

Figure 4:
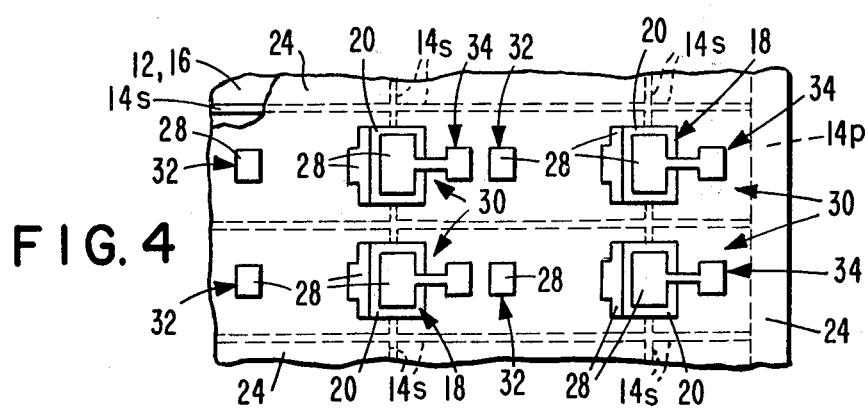
FIG. 4 is a plan view similar to FIG. 3, showing the tantalum thin film RC networks in an intermediate stage of manufacture as shown in FIG. 2G.

As is shown in FIGS. 2G and 4, after the plating of the electrically conductive gold film 28, the electrically conductive films 26 and 29 are selectively etched away using a photolithographic masking process to define the conductor networks 30, including portions of the contact pads 32 and 34 formed by these films, and to define the portions of the capacitor counterelectrodes 22 (FIG. 2H) formed by these films. The etching of the electrically conductive films 26 and 28 may be accomplished in any suitable manner, such as by immersing the masked substrate assembly as illustrated by FIG. 2F in a potassium iodide-iodine-water solution for the purpose of simultaneously removing portions of the outer gold layer 28 and the underlying palladium portions of the dual adhesive "glue" layer 26. The underlying titanium portions of the dual adhesive "glue" layer 26 then may be removed with a hydrofluoric acid (4% by volume)-nitric acid (4% by volume)-water etching solution.

With reference to FIGS. 2H and 5, the tantalum nitride resistor film 24 then is suitably masked and etched to remove portions of this film simultaneously so as to form the resistors 24r and to complete the formation of the conductor networks 30, the etching operation including the etching away of small portions of the tantalum nitride resistor film formed on the anodized capacitor dielectrics 20 to form the portions 24ce of the capacitor counterelectrodes 22 formed by the tantalum nitride resistor film, thus completing the formation of the RC networks 10 on the substrate 12. Preferably, the tantalum nitride film portion 24ce of each capacitor counterelectrode 22 is formed slightly larger than the overlying portions of the electrically conductive film layers 26 and 28, as illustrated in FIGS. 1 and 2H, to avoid undercutting of these overlying portions. Further, in this etching operation, portions of the tantalum nitride resistor film 24 overlying the alpha tantalum secondary bus bars 14s (FIG. 4), and these bus bars, are removed simultaneously and in their entirety as shown in FIG. 5. By way of illustration, this simultaneous etching of the overlying portions of the tantalum nitride resistor film 24 and the alpha tantalum film bus bars 14s may be accomplished utilizing the same 5:1:1 hydrofluoric acid-nitric acid-water solution utilized to etch the alpha tantalum film layer 14 in FIG. 2B.

The RC networks 10 of the substrate assembly as shown in FIG. 5 now are suitably heat treated to thermally stabilize the completely formed capacitors 18 and resistors 24r. By way of illustration, for capacitors 18 having dielectrics 20 formed using a 210 volt capacitor dielectric forming voltage, as noted hereinabove, favorable thermal stabilization results have been achieved at a temperature on the order of 300° C. for a time period of on the order of four hours. In this connection, the thermal stabilization of the RC networks 10 after their fabrication has been completed causes resistor and capacitor properties, such as long term stability and temperature coefficient of resistance and capacitance, as well as the dissipation factor of the capacitors 18, to improve in their characteristics, resulting in precise RC networks which will be stable under operating conditions.

In subsequent processing following heat treatment, the RC networks 10 on the substrate assembly as shown in FIG. 5 are separated into discrete independent units as shown in FIGS. 1 and 2H in a substrate scribing and separating operation in a known manner.

INDUSTRIAL APPLICATION

In summary, a new and improved method of fabricating precise and reliable RC networks 10 as shown in FIGS. 1 and 2H utilizing alpha tantalum has been disclosed. For example, with regard to the prior art method described herein in the background of the invention, the subject method is capable of producing more precise and reliable RC networks 10 with a reduced number of processing steps and fewer mask levels.

In this connection, in the disclosed method the capacitance dielectrics 20 are formed to a desired physical configuration and thickness in a single anodizing step as illustrated in FIG. 2C, rather than in two separate steps. Further, since the tantalum nitride resistor film 24 (FIG. 2D), the inner electrically conductive adhesive "glue" layer 26 (FIG. 2E) and the outer electrically conductive film 28 (FIG. 2F) are deposited in direct sequence, followed immediately by formation of the capacitors 18 (FIGS. 2G and 2H) and the resistors 24r (FIG. 2H), the need for special "contact spots" to insure good ohmic contact between the tantalum nitride film and the subsequently formed capacitors and resistors has been eliminated. In addition, in the subject method the secondary alpha tantalum anodization bus bars 14s are removed simultaneously with the etching of the tantalum nitride resistor film 24 to define the resistors 24r and the capacitor counterelectrode portions 24ce, as illustrated in FIGS. 4 and 5, rather than in a separate independent step. The thermal stabilization of the RC networks 10 after their fabrication has been completed also is advantageous from the standpoint of producing precise units which are stable under operating conditions.

Figure 3:
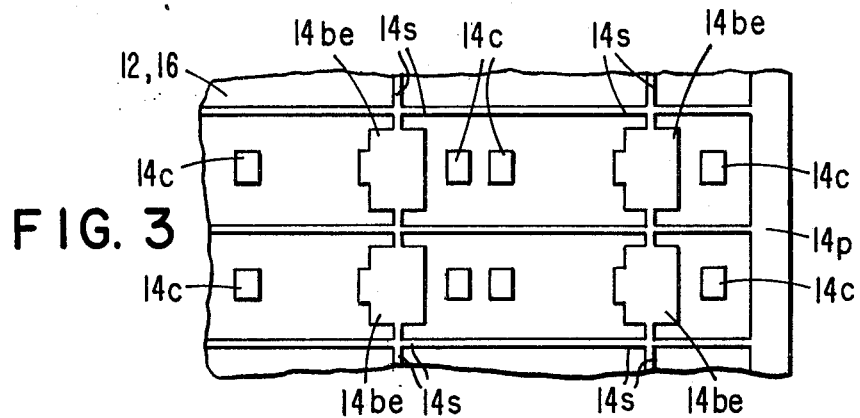
FIG. 3 is a plan view of a plurality of tantalum thin film RC networks being fabricated on a substrate in accordance with the invention, in an intermediate stage of manufacture as shown in FIG. 2B.

In the disclosed method, initially the alpha tantalum film 14 is deposited on the tantalum pentoxide underlayer 16 on the substrate 12 as shown in FIG. 2A, such as by magnetically enhanced sputtering. The alpha tantalum film 14 then is selectively etched to define the capacitor base electrodes 14be and the inner portions 14c of the contact pads 32 and 34 (FIGS. 1 and 2H) as shown in FIGS. 2C and 3. At the same time portions of the alpha tantalum film 14 are removed to define the anodization bus bars 14p and 14s as shown in FIG. 3.

Referring to FIG. 2C, portions of the capacitor base electrodes 14be then are anodized to form the capacitor dielectrics 20 to a desired physical configuration and final thickness in a single anodizing step. The tantalum nitride resistor film 24 then is deposited over the resultant substrate assembly, such as by magnetically enhanced sputtering, as shown in FIG. 2D.

The electrically conductive dual adhesive "glue" layer 26 then is deposited upon the tantalum nitride resistor film 24 as shown in FIG. 2E by the magnetically enhanced sequential sputtering of titanium and palladium. The outer electrically conductive gold film 28 then is plated over the dual adhesive "glue" layer 26 as shown in FIG. 2F.

Referring to FIG. 2G, portions of the electrically conductive films 26 and 28 then are removed from the substrate assembly by etching to define portions of the capacitor counterelectrodes 22 (FIG. 2H) defined by these films, to expose sections of the tantalum nitride resistor film 24 destined for use as the resistors 24r (FIG. 2H), and to define the conductor networks 30. As is illustrated in FIG. 2H, portions of the tantalum nitride resistor film 24 then are removed by etching to define the capacitor counterelectrode portions 24ce formed by the tantalum nitride resistor film, and to define the resistors 24r (also shown in FIG. 5). In the same step, the etchant removes portions of the tantalum nitride resistor film 24 overlying the secondary alpha tantalum anodization bus bars 14s and also removes the bus bars, as illustrated in FIG. 5. The resistance and capacitance properties of the RC networks 10 as shown in FIG. 5 then are thermally stabilized by heat treatment, after which the RC networks are separated into discrete independence units as shown in FIGS. 1 and 2H.

What is claimed is:

1. A thin film capacitor, which comprises:
    an alpha tantalum base electrode having first and second adjacent portions;
    a capacitor dielectric formed on only the first portion of the base electrode such that the second portion of the base electrode can be direct-connected to an electrical conductor; and
    a capacitor counterelectrode formed on the capacitor dielectric, the capacitor counterelectrode including a layer of tantalum nitride formed in direct contact with a first portion of the capacitor dielectric, the layer of tantalum nitride extending over the first portion of the capacitor dielectric from adjacent one end of the dielectric toward the second portion of the base electrode in essentially parallel relationship to the first portion of the base electrode and terminating in spaced relationship to the second portion of the base electrode such that the tantalum nitride layer and the second portion of the base electrode are separated by a second portion of the capacitor dielectric.

2. A thin film capacitor as recited in claim 1, wherein the second portion of the the capacitor base electrode is electrically connected to a tantalum nitride resistor to form a thin film RC network.

3. A thin film capacitor as recited in claim 1, in which the capacitor counterelectrode further includes:
    an electrically conductive adhesive layer, which includes a film of titanium, overlying the tantalum nitride layer formed in direct contact with the capacitor dielectric; and
    an electrically conductive layer overlying the electrically conductive adhesive layer.

4. A thin film capacitor as recited in claim 3, in which the electrically conductive adhesive layer of the capacitor counterelectrode includes a film of palladium between the film of titanium and the electrically conductive layer.

5. A thin film RC network, which comprises:
an alpha tantalum base electrode having first and second adjacent portions;
a capacitor dielectric formed on only the first portion of the base electrode such that the second portion of the base electrode can be direct-connected to an associated circuit path;
a capacitor counterelectrode formed on the capacitor dielectric, the capacitor counterelectrode including a layer of tantalum nitride formed in direct contact with a first portion of the capacitor dielectric, the layer of tantalum nitride extending over the first portion of the capacitor dielectric from adjacent one end of the dielectric toward the second portion of the base electrode in essentially parallel relationship to the first portion of the base electrode and terminating in spaced relationship to the second portion of the base electrode such that the tantalum nitride layer and the second portion of the base electrode are separated by a second portion of the capacitor dielectric;
a tantalum nitride resistor electrically connected to one of the electrodes; and
a conductor network direct-connected by associated circuit paths, including the tantalum nitride resistor, to the capacitor counterelectrode and the second portion of the base electrode.

6. A thin film RC network as recited in claim 5, in which the capacitor counterelectrode further includes:
an electrically conductive adhesive layer, which includes a film of titanium, overlying the tantalum nitride layer formed in direct contact with the capacitor dielectric; and
an electrically conductive layer overlying the electrically conductive adhesion layer.

7. A thin film RC netwok as recited in claim 6, in which the electrically conductive adhesive layer of the capacitor counterelectrode includes a film of palladium between the film of titanium and the electrically conductive layer.

* * * * *